(12) United States Patent
Boehlmann et al.

(10) Patent No.: US 8,147,670 B2
(45) Date of Patent: Apr. 3, 2012

(54) PROFILE CONTROL ON RING ANODE PLATING CHAMBERS FOR MULTI-STEP RECIPES

(75) Inventors: Sylvia Boehlmann, Dresden (DE); Dirk Wollstein, Dresden (DE); Susanne Wehner, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 736 days.

(21) Appl. No.: 12/119,730

(22) Filed: May 13, 2008

(65) Prior Publication Data
US 2009/0057153 A1     Mar. 5, 2009

(30) Foreign Application Priority Data

Aug. 31, 2007  (DE) .......................... 10 2007 041 205
Feb. 18, 2008  (DE) .......................... 10 2008 009 641

(51) Int. Cl.
*C25D 21/12*        (2006.01)
(52) U.S. Cl. ............... 205/81; 205/82; 205/96; 700/121
(58) Field of Classification Search ................ 205/81
See application file for complete search history.

(56) References Cited

U.S. PATENT DOCUMENTS

| | | | |
|---|---|---|---|
| 6,027,631 A | 2/2000 | Broadbent | 205/137 |
| 6,113,462 A | 9/2000 | Yang | 451/5 |
| 6,213,848 B1 | 4/2001 | Campbell et al. | 451/41 |
| 6,217,412 B1 | 4/2001 | Campbell et al. | 451/8 |
| 6,350,179 B2 | 2/2002 | Campbell et al. | 451/41 |
| 6,387,800 B1 | 5/2002 | Liu et al. | 438/653 |
| 6,546,306 B1 | 4/2003 | Bushman et al. | 700/121 |
| 6,592,429 B1 | 7/2003 | Campbell | 451/8 |
| 2002/0125141 A1 | 9/2002 | Wilson et al. | 205/96 |
| 2002/0139678 A1* | 10/2002 | Wilson et al. | 205/96 |
| 2004/0265562 A1* | 12/2004 | Uzoh et al. | 428/306.6 |
| 2005/0067290 A1* | 3/2005 | Bonkass et al. | 205/84 |
| 2005/0173241 A1* | 8/2005 | Chalupa et al. | 204/228.9 |

FOREIGN PATENT DOCUMENTS

WO    WO 01/91163 A2    11/2001

\* cited by examiner

*Primary Examiner* — Harry D Wilkins, III
*Assistant Examiner* — Bryan D. Ripa
(74) *Attorney, Agent, or Firm* — Williams, Morgan & Amerson, P.C.

(57) ABSTRACT

The present disclosure generally addresses the problem of controlling a plating profile in multi-step recipes and addresses, in particular, the problem of compensating for variations of the plating tool state to stabilize the plating results. The compensation is done by adjustments of corrections factors for currents of a plating tool in a multi-anode configuration. The described method enables control of recipes with different current ratios in each recipe step and models different deposition sensitivities in each recipe step. Generally, the method of the present disclosure requires a measurement step, where the tool state is determined, and a data processing step, where the correction factors are set based on models describing the plating process and the tool state.

25 Claims, 1 Drawing Sheet

PROFILE CONTROL ON RING ANODE PLATING CHAMBERS FOR MULTI-STEP RECIPES

BACKGROUND OF THE INVENTION

1. Field of the Invention

The present disclosure relates to the process of depositing a metal on a substrate surface, using a reactor for electroplating, and, in particular, to profile control on ring anode plating chambers.

2. Description of the Related Art

In many technical fields, the deposition of metal layers on a substrate surface is a frequently employed technique. For efficiently depositing relatively thick metal layers on a substrate surface, plating, in the form of electroplating or electroless plating, has proven to be a viable and cost-effective method and, thus, plating has become an attractive deposition method in the semiconductor industry.

Currently, copper is considered a preferred candidate in forming metallization layers in sophisticated integrated circuits, due to the superior characteristics of copper and copper alloys in view of conductivity and resistance to electromigration compared to, for example, the commonly used aluminum. Since copper may not be deposited very efficiently by physical vapor deposition, for example by sputter deposition, with a layer thickness on the order of 1 μm and more, electroplating of copper and copper alloys is the currently preferred deposition method in forming metallization layers. Although electroplating of copper is a well-established technique, reliably depositing copper over large diameter substrates, having a patterned surface including trenches and vias, is a challenging task for process engineers. For example, forming a metallization layer of an ultra-large scale integration device requires the reliable filling of wide trenches with a width on the order of micrometers and also requires the filling of vias and trenches having a diameter or width of 0.2 μm or even less, which is also known as the so-called dual inlaid technology. The situation gains even more in complexity as the diameters of the substrates tend to increase. Currently eight or even ten inch wafers are commonly used in a semiconductor process line. Thus, great efforts are being made in the field of copper plating to provide the copper layer in a desired profile across the substrate surface. At a first glance, it appears to be advantageous that the metal thickness profile across the substrate surface may be formed as uniformly as possible. However, post-plating processes may require a differently shaped profile to assure proper device functionality of the completed integrated circuits. For instance, during the formation of copper-based metallization layers, excess copper may be removed, which is presently often achieved by (electro) chemical mechanical polishing ((e)CMP) of the metal surface. Since the CMP process is per se a highly complex process frequently exhibiting an intrinsic process non-uniformity, i.e., a non-uniform removal rate across the substrate surface, it may be preferable to adapt the metal thickness profile to the post-plating process to achieve in total an improved process uniformity after completion of the post-plating process. Therefore, electroplating tools are often configured to allow a variation of the metal profile, wherein the control of the finally obtained profile presently is, however, cumbersome and time-consuming.

With reference to FIGS. 1a-1b, a typical prior art electroplating system will now be described to illustrate in more detail the problems involved in electroplating copper. In FIG. 1a, there is shown a typical conventional electroplating system 100 including a reactor vessel 101 with a first electrode 102, in this case the anode, having a plurality of individually drivable anode portions 102A-102N, thereby defining a multiple anode configuration. In this example, a so-called fountain-type reactor is considered, in which an electrolyte solution is directed from the bottom of the reactor vessel 101 to the top side and is then re-circulated by a pipe 103 connecting an outlet 104 with a storage tank 107, which in turn is connected to an inlet 105 provided as a passage through the anode 102. The system 100 further comprises a substrate holder 108 that is configured to support a substrate 109, such as a semiconductor wafer, so as to expose a surface of interest to the electrolyte. Moreover, the substrate holder 108 may be configured to act as a second electrode, in this case the cathode, and to provide the electrical connection to a power source 110, which is configured to enable the supply of individual currents of defined magnitude to each of the anode portions 102A-102N.

FIG. 1b schematically shows a top view of the electrode 102 including the multiple anode configuration 102A-102N for four individual anode portions.

Prior to installing the substrate 109 on the substrate holder 108, a thin current distribution layer, possibly including a seed layer, typically provided by sputter deposition, is formed on the surface of the substrate 109 that will receive the metal layer. Thereafter, the substrate 109 is mounted on the substrate holder 108, wherein small contact areas (not shown for the sake of simplicity) provide electrical contact to the power source 110 via the substrate holder 108. By activating a pump (not shown) and applying appropriate voltages between the anode 102, that is, the multiple anode configuration 102A-102N, and the substrate holder 108 that creates respective currents, an electrolyte flow is created within the reactor vessel 101. The electrolyte entering the reactor vessel 101 at the inlet 105 is directed towards the substrate 109, wherein the deposition of metal on the substrate 109 is determined by the flow of electrolyte and the arrangement of the multiple anode configuration 102A-102N, since the local deposition rate of metal on a specific area of the surface of the substrate 109 depends on the number of ions arriving at this area. Hence, by selecting a set of currents supplied to the multiple anode configuration 102A-102N, the finally obtained thickness profile may be determined, wherein, optionally, additional means for influencing the ion and/or electrolyte flow may be inserted in the form of, for instance, a diffuser plate.

Once an appropriate set of currents is adjusted in the power supply 110, the resulting thickness profile is determined by the characteristics of the reactor vessel 101, the electrolyte solution, the set of currents and the plating time. Hence, a variation of one of these characteristics may lead to a drift of the finally obtained thickness profile. The situation is even more complex for an electroplating tool 100 including a plurality of reactor vessels 101 with a corresponding plurality of multiple anode configurations 102A-102N, since then any subtle process fluctuation in any of these reactor vessels may occur and may result in a highly complex mutual interaction of the involved process characteristics, thereby compromising process stability. Thus, a plurality of test substrate runs is typically performed on a regular basis, thereby requiring time and manpower and hence reducing the yield and quality of the plating process.

Increasing complexity of integrated structures leads to further drawbacks of current profile control methods. For instance, forming a metallization layer of an ultra-large scale integration device requires the reliable filling of wide trenches with a width on the order of micrometers, and also requires the filling of vias and trenches having a diameter or width of 0.2 μm or even less. For economical reasons, the different structures, whose dimensions may differ by an order of magnitude, are filled in a continuous process step. The process step has to be subdivided into a step which is optimal for filling small structures and a successive step of filling the large structures. This can be practically done by, for instance, using the pulse reverse current technique, wherein, after each deposition current pulse, a reverse pulse is followed which removes some of the deposited material in order to avoid cavities during the deposition process. The large structures may be filled after the pulse reverse current, for instance, by a direct current method. However, any combination of deposition characteristics may be used according to the process requirements and the intended results. For instance, the direct current step may be replaced by a pulse reverse current step having lower or higher frequencies than the step before.

Therefore, filling small and large structures requires multi-step recipes for the plating process such that more tool parameters have to be considered for the plating process. Also, the process complexity makes plating results sensitive to tool drifts due to wear or consumable status.

Currently, with the multi-anode plating chamber solution, an automatic calculation to adjust the post-plating shape is possible, requiring a constant ratio of the anode currents in all recipe steps.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one embodiment of this disclosure, a method for automatically optimizing a plating profile for multi-step recipes in a multi-anode plating tool comprises determining a tool state by measuring a difference between a qualification profile of material deposited according to a qualification recipe with a plating tool that is in an unknown state and a target profile of material deposited according to the qualification recipe with a plating tool that is in an optimal tool state, compensating for said difference by adjusting correction factors of currents for each anode of the multi-anode plating tool and calculating correction factors for a process recipe.

According to another embodiment of this disclosure, a method for automatically optimizing a plating profile for multi-step recipes in a multi-anode plating tool comprises a qualification step of determining correction factors of anode currents for each step of a multi-step qualification recipe and a tool setting step for tuning tool settings by deriving correction factors for the anode currents of the multi-anode plating tool for each step of a particular process recipe.

BRIEF DESCRIPTION OF THE DRAWINGS

The disclosure may be understood by reference to the following description taken in conjunction with the accompanying drawings, in which like reference numerals identify like elements, and in which.

Figure 1A:
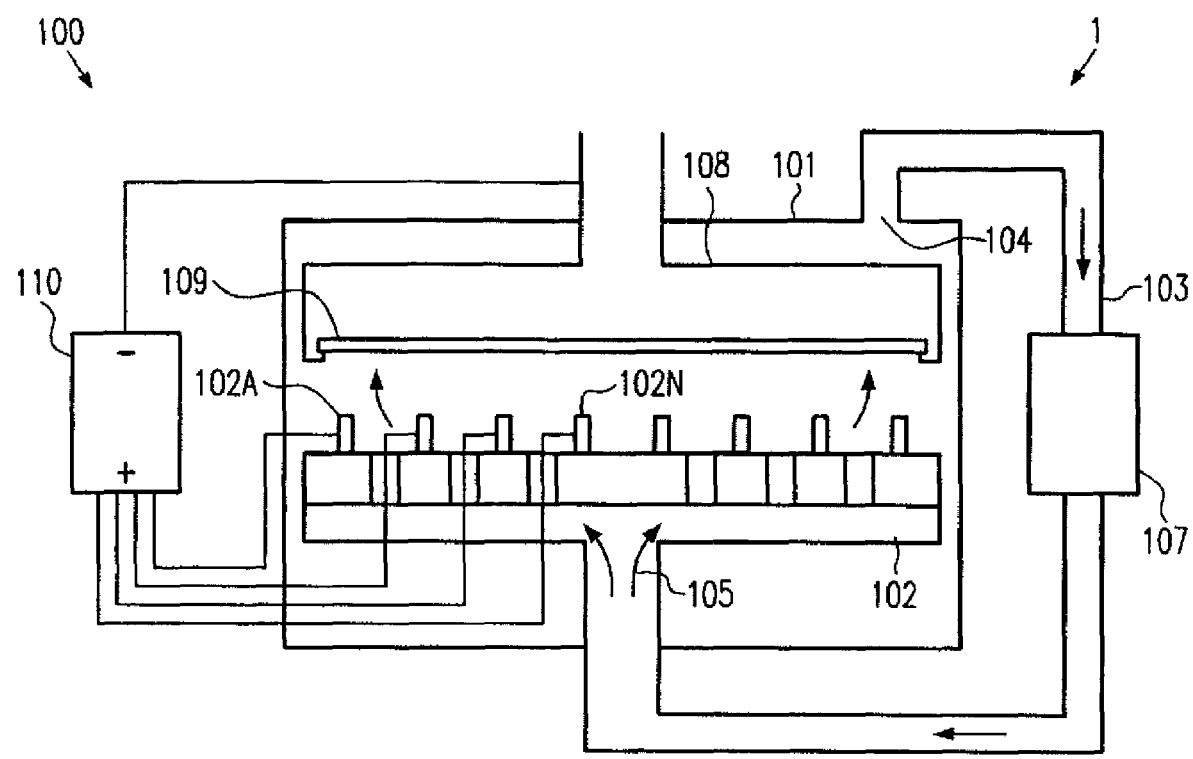
FIGS. 1a-1b schematically show a sketch of a conventional plating system and a multi-anode configuration.
Figure 1B:
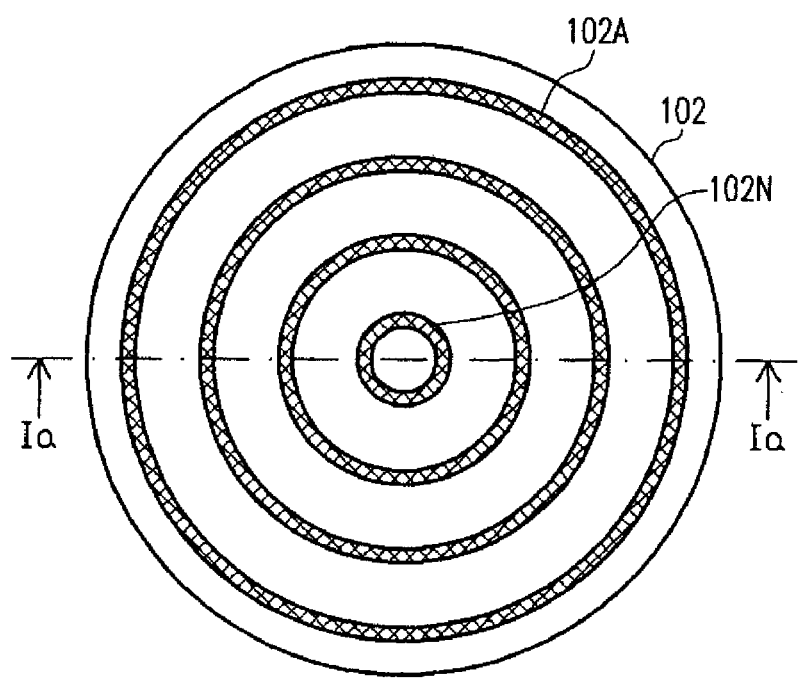

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally addresses the problem of controlling a plating profile in multi-step recipes and addresses, in particular, the problem of compensating for variations of the plating tool state to stabilize the plating results. The compensation is done by adjustments of correction factors for currents of a plating tool in a multi-anode configuration. The described method enables control of recipes with different current ratios in each recipe step and models different deposition sensitivities in each recipe step.

Generally, the methods of the present disclosure may require measurement data, where the tool state is determined, and data processing, where the correction factors are set, based on models describing the plating process and the tool state.

Obtaining the measurement data comprises measuring a difference between a qualification profile of material deposited according to a qualification recipe with a plating tool that is in an unknown state and a target profile of material deposited according to the qualification recipe with a plating tool that is in an optimal tool state.

The data processing comprises expressing a target profile of a process recipe in terms of a difference to the target profile of the qualification recipe, expressing an estimated profile of a process recipe in terms of a difference to the qualification profile of the qualification recipe and minimizing the difference between the estimated profile of the process recipe and the target profile of the process recipe by setting appropriate corrections.

Embodiments disclosed herein may extend methods of the state of the art to deal with arbitrary ratios of the anode currents in each recipe step.

The techniques disclosed herein provide efficient process control to reach a given copper shape, which is superior for the downstream polish process.

The following illustrative embodiments describe the control of a two-step recipe. The concept may be easily extended to a multiple-step recipe. Each of the recipe steps may have different currents and different deposition characteristics, e.g., direct current or pulse reverse current. Thus, the steps may have different deposition sensitivities. The sensitivity may be known in advance or may be determined by sensitivity experiments.

In order to better understand the terms "sensitivity" and "correction factors," the following explanation is given. The deposition of metal on the substrate is determined by the flow of electrolyte and the arrangement of the multiple anode configuration, since the local deposition rate of metal on a specific area of a surface of the substrate depends on the number of ions arriving at this area. The resulting thickness profile is determined not only by the individual currents flowing through any one of the plurality of anodes, but is also determined by the characteristics of the reactor vessel, the electrolyte solution and the characteristics of the wafer itself. Generally, the plating profile may be described by the following formula A:

$$M(r) = S(r) \cdot I(r) \cdot t \tag{A}$$

M(r) is the thickness profile of the deposited copper. In this case, a circular symmetry may be assumed wherein the thickness of the copper depends only on the radius r in a polar coordinate system. It may be appreciated that limiting the dependency only on the radial coordinate serves only for illustrative purposes. As is well known, an angular dependence of the thickness profile in case of a polar coordinate system is also possible. I(r) designates the local current at the coordinate r. t is the time of current flow. I(r)·t designates the total deposited charge Q at the radius r. Although it is assumed in a first approach that all of the total charge Q is deposited at the respective radius r, in the real situations, typically many influences may occur which disturb the deposition of the copper having the charge Q at the particular radial position r. This influence is taken into consideration with a correction factor, a so-called sensitivity function S(r), which subsumes the aforementioned reactor vessel and substrate characteristics.

The control over the deposition profile M(r) is achieved by the particular multi-anode configuration which allows local adjustment of the deposition current due to the configuration of the anodes. If, for instance, the anodes are arranged in a circular shape at different radii, the deposition profile M(r) may be influenced radius-dependent.

The total amount of deposited charge/copper is given according to formula B:

$$Q = \int_{r=-R}^{+R} I(r) \cdot t \cdot dr = I_{total} \cdot t \tag{B}$$

Since, in a multi-anode configuration, the total current $I_{total}$ is realized by the sum of the individual currents of the respective anodes, the total current $I_{total}$ may be described as in the following formula C:

$$I_{total} = I_{Anode1} + I_{Anode2} + I_{Anode3} + \tag{C}$$

Formula B may then be written in a discrete form according to formula D:

$$Q = \sum_i I_{Anodei}(r_i) \cdot t = \begin{pmatrix} I_{Anode1}(r_1) I_{Anode2}(r_2) + \\ I_{Anode3}(r_3) + \ldots \end{pmatrix} \cdot t \tag{D}$$

Since the deposited charge/copper is not completely under the control of a respective anode and its position, which is subsumed with the sensitivity function S(r), the currents of respective anodes have to be corrected. Formula E gives a more general expression for external influences:

$$S(r) = S(r, A_1(r), A_2(r), \ldots) \tag{E}$$

S(r) represents the aforementioned sensitivity function for particular positions r indicating the affinity of particular positions r for depositing a charged particle like copper. $A_1(r)$ and $A_2(r)$ may represent, for instance, electrolyte concentration at a particular position r depending on, for instance, consumable status and flow profile of the electrolyte. Also, pattern density, etch depth, trench width, wafer stepping and material and crystal orientation of an underlayer on the substrate, as well as the distribution of the seed layer across the wafer, may have an influence on the sensitivity parameter S(r). The sensitivity factor requires a correction of each of the currents corresponding to particular anodes. This may be, for instance, considered by applying a particular correction factor to each anode current as exemplified, for instance, with formula F:

$$I_{total} = I_{Anode1} \cdot CF1 + I_{Anode2} \cdot CF2 + I_{Anode3} \cdot CF3 + \tag{F}$$

Formula F indicates that a correction factor CF1, CF2, CF3 . . . is applied to the respective anode currents $I_{Anode1}$, $I_{Anode2}$, $I_{Anode3}$ . . . in order to achieve the intended deposition profile.

It has to be understood that the corrections of the anode current is not restricted to a correction factor, but an offset may also be applied individually to each anode current. Further, the described plating tool is not limited to a fountain-type plating tool. Other types of plating tools, such as electrolyte baths and the like, may be used as well. Thus, the present disclosure is to be understood as not being restricted to a specific type of electroplating tool.

The default currents and charges are fixed for a given recipe, while the correction factors are tuned to compensate for tool drifts. The default currents are defined in a way that they provide an optimal copper profile if the tool works in an optimal tool state. Variations of the tool state may thus be compensated for by adjustments of the correction factors.

A given target profile $T^Q(r)$ is assumed for the qualification recipe Q. A given target profile is the profile that the tool reaches under optimal conditions without any current corrections (all current correction factors are 1).

If a recipe contains, e.g., two steps, the copper thickness across the wafer consists of two portions according to the deposited thickness in recipe step 1 and the deposited thickness in recipe step 2. For enhancing the accuracy of the model that may describe changes of the recipe settings (correction factors, currents or charges) around a given point, but may not capture any tool state components, a qualification recipe Q is used to obtain the tool state. The current state of the plating chamber is given by a measured profile of a wafer processed with the qualification recipe Q and a correction factor CF. The qualification profile is only measured on certain sites of the wafer. From the measurement data, a function may be defined using, for instance, an interpolation method.

The illustrative embodiments described herein enable control of recipes with different current ratios in each recipe step and model different deposition sensitivities in each recipe step.

The methods may be based on a general thickness model for a two step (or more) recipe describing the thickness profile of a plating process as illustrated in formula 1:

$$Thk^R\left(r, \overrightarrow{CF}^{1,R}, \overrightarrow{CF}^{2,R}\right) := Thk^{1,R}\left(r, \overrightarrow{CF}^{1,R}\right) + Thk^{2,R}\left(r, \overrightarrow{CF}^{2,R}\right) := \quad (1)$$

$$\frac{AS^{1,R}}{\sum_{k=1}^{n} CF_k^{1,R} I_k^{1,R}} \left(\sum_{i=1}^{n} S_i^1(r) CF_i^{1,R} I_i^{1,R}\right) +$$

$$\frac{AS^{2,R}}{\sum_{k=1}^{n} CF_k^{2,R} I_k^{2,R}} \left(\sum_{i=1}^{n} S_i^2(r) CF_i^{2,R} I_i^{2,R}\right)$$

$Thk^R$ denotes a thickness profile for a recipe R with given:

$I_k^{1,R}$ Anode currents of recipe step 1;

$I_k^{2,R}$ Anode currents of recipe step 2;

$CF_k^{1,R}$ correction factors of recipe step 1 for anode currents $I_k^{1,R}$;

$CF_k^{2,R}$ correction factors of recipe step 2 for anode currents $I_k^{2,R}$;

$AS^{1,R}$ charge of recipe step 1 (total deposition amount in step 1);

$AS^{2,R}$ charge of recipe step 2 (total deposition amount in step 2);

$S_i^1(r)$ sensitivity for Anode i on radius r in recipe step 1;

$S_i^2(r)$ sensitivity for Anode i on radius r in recipe step 2; and n number of anodes wherein:

$Thk^{1,R}$ denotes a thickness profile for a recipe R in step 1; and $Thk^{2,R}$ denotes a thickness profile for a recipe R in step 2.

It has to be noted that the sensitivities $S_i^1(r)$ and $S_i^2(r)$ may represent sensitivity functions without cross sensitivities, while in other embodiments more complex sensitivity functions may be determined.

In the following, a detailed description of method steps of an illustrative embodiment is given for a four-anode model.

1. Obtaining Measurement Data Related to the Tool State

Step 1: Using thickness profile $Thk^Q(r, \overrightarrow{CF}^{1,Q}, \overrightarrow{CF}^{2,Q})$ for determining the two parts of measured and interpolated thickness profile $QualThk^Q(r)$ by formula 2:

$$QualThk(r) := \quad (2)$$

$$QualThk^1(r) QualThk^2(r) := QualThk(r) \frac{Thk^{1,Q}\left(r, \overrightarrow{CF}^{1,Q}\right)}{Thk^Q\left(r, \overrightarrow{CF}^{1,Q}, \overrightarrow{CF}^{2,Q}\right)} +$$

$$QualThk(r) \frac{Thk^{2,Q}\left(r, \overrightarrow{CF}^{2,Q}\right)}{Thk^Q\left(r, \overrightarrow{CF}^{1,Q}, \overrightarrow{CF}^{2,Q}\right)}$$

wherein $Thk^Q(r, \overrightarrow{CF}^{1,Q}, \overrightarrow{CF}^{2,Q})$ denotes a thickness profile for a corrected qualification recipe Q with particular correction factors $\overrightarrow{CF}^{1,Q}, \overrightarrow{CF}^{2,Q}$; $QualThk^Q(r)$ denotes a thickness profile based on measured data that may be interpolated for a corrected qualification recipe Q with particular correction factors $\overrightarrow{CF}^{1,Q}, \overrightarrow{CF}^{2,Q}$ thereby reflecting a tool state; $QualThk^{1,Q}(r, \overrightarrow{CF}^{1,Q})$ denotes a thickness profile of step 1 based on measured data that may be interpolated; and $QualThk^{2,Q}(r, \overrightarrow{CF}^{2,Q})$ denotes a thickness profile of step 2 based on measured data that may be interpolated.

Step 2: Using thickness profile $Thk^Q(r,(1,1,1,1))$ without corrections for determining the two parts of desired target thickness profile $T^Q(r)$ by formula 3:

$$T^Q(r) := \quad (3)$$

$$T^{1,Q}(r) + T^{2,Q}(r) := T^Q(r) \frac{Thk^{1,Q}(r,(1,1,1,1))}{Thk^Q(r,(1,1,1,1),(1,1,1,1))} +$$

$$T^Q(r) \frac{Thk^{2,Q}(r,(1,1,1,1))}{Thk^Q(r,(1,1,1,1),(1,1,1,1))}$$

wherein $Thk^Q(r,(1,1,1,1),(1,1,1,1))$ denotes a thickness profile for a qualification recipe Q for a plating tool under optimal conditions; $T^Q(r)$ denotes a desired target thickness profile that reflects optimal tool state; $T^{1,Q}(r)$ denotes a desired target thickness profile of step 1; and $T^{2,Q}(r)$ denotes a desired target thickness profile of step 2.

Step 2.A: At this point, correction factors may be determined by calculating a differential tool state $\Delta ToolState$ according to formula 4:

$$\Delta ToolState := \quad (4)$$

$$\int_0^R (|QualThk^1(r) - T^{1,Q}(r)| + |QualThk^2(r) - T^{2,Q}(r)|) dr$$

followed by minimizing the differential tool state $\Delta ToolState$ by adjusting correction factors for qualification recipe Q according to formula 5:

$$\min_{\overrightarrow{CF}^{1,Q}, \overrightarrow{CF}^{2,Q}} \Delta ToolState \quad (5)$$

It has to be noted that step 2A may be carried out in combination with the following steps in order to improve accuracy and stability of results or may be omitted for increasing adjustment speed.

2. Data Processing and Evaluation

Step 3: Calculating target profile $T^R(r)$ for recipe R for a deposition tool under optimal conditions in terms of a difference to a qualification recipe Q (by use of formula 3) according to formula 6:

$$T^R(r) := \quad (6)$$

$$T^{1,R}(r) + T^{2,R}(r) := \frac{AS^{1,R}}{AS^{1,Q}}\left[T^{1,Q}(r) + \frac{AS^{1,Q}}{AS^{1,R}}Thk^{1,R}(r,(1,1,1,1)) - Thk^{1,Q}(r,(1,1,1,1))\right] + \frac{AS^{2,R}}{AS^{2,Q}}$$

$$\left[T^{2,Q}(r) + \frac{AS^{2,Q}}{AS^{2,R}}Thk^{2,R}(r,(1,1,1,1)) - Thk^{2,Q}(r,(1,1,1,1))\right]$$

wherein $T^R(r)$ designates a desired target thickness profile of a process recipe, $T^{1,R}(r)$ designates a desired target thickness profile of step 1, and $T^{2,R}(r)$ designates a desired target thickness profile of step 2. $T^{1,Q}(r)$ is used from formula 3 and reflects the optimal tool state for step 1. $T^{2,Q}(r)$ is used from formula 3 and reflects the optimal tool state for step 2. $AS^{1,R}/AS^{1,Q}$ and $AS^{2,R}/AS^{2,Q}$ designate changes of the charges of deposited material between the qualification recipe and the process recipe. $Thk^{1,Q}(r,(1,1,1,1))$ and $Thk^{2,Q}(r,(1,1,1,1))$ are used from formula 3 and designate a thickness profile for a qualification recipe Q for a plating tool under optimal conditions where correction factors are set to 1. $Thk^{1,R}(r,(1,1,1,1))$ and $Thk^{2,R}(r,(1,1,1,1))$ designate a calculated thickness profile for a given process recipe R for a plating tool under optimal conditions where correction factors are set to 1.

Step 4: Calculating estimated thickness $ThkEst^R(r)$ for recipe R in terms of a difference to a qualification recipe Q (by use of formula 2) according to formula 7:

$$ThkEst^R\left(r,\overrightarrow{CF}^{1,R},\overrightarrow{CF}^{2,R}\right) := \quad (7)$$

$$ThkEst^{1,R}\left(r,\overrightarrow{CF}^{1,R}\right) + ThkEst^{2,R}\left(r,\overrightarrow{CF}^{2,R}\right) :=$$

$$\frac{AS^{1,R}}{AS^{1,Q}}\left[Thk^{1,Q}(r) + \frac{AS^{1,Q}}{AS^{1,R}}Thk^{1,R}\left(r,\overrightarrow{CF}^{1,R}\right) - Thk^{1,Q}\left(r,\overrightarrow{CF}^{1,Q}\right)\right] +$$

$$\frac{AS^{2,R}}{AS^{2,Q}}\left[Thk^{2,Q}(r) + \frac{AS^{2,Q}}{AS^{2,R}}Thk^{2,R}\left(r,\overrightarrow{CF}^{2,R}\right) - Thk^{2,Q}\left(r,\overrightarrow{CF}^{2,Q}\right)\right]$$

wherein $Thk^{1,Q}(r)$ and $Thk^{2,Q}(r)$ designate thickness profile calculated with formula 1 for the qualification recipe for step 1 and 2; $AS^{1,R}/AS^{1,Q}$ and $AS^{2,R}/AS^{2,Q}$ designate changes of the charges of deposited material between the qualification recipe Q and the process recipe R. $Thk^{1,Q}(r,\overrightarrow{CF}^{1,Q})$ and $Thk^{2,Q}(r,\overrightarrow{CF}^{2,Q})$ are used from formula 2 and designate a thickness profile for a qualification recipe Q for a plating tool in a known state; and $Thk^{1,R}(r,\overrightarrow{CF}^{1,R})$ and $Thk^{2,R}(r,\overrightarrow{CF}^{2,R})$ designate a calculated thickness profile for a given process recipe R for a plating tool with arbitrary correction factors.

Step 5: calculating optimization problem analogously to formulas 4 and 5:

$$\min_{\overrightarrow{CF}^{1,R},\overrightarrow{CF}^{2,R},Thk^{offset}}\int_0^R\left|ThkEst^R\left(r,\overrightarrow{CF}^{1,R},\overrightarrow{CF}^{2,R}\right) - T^R(r) + Thk^{offset}\right|dr \quad (8)$$

with the following conditions:

$$CF_{min}^{1,i} \leq CF^{1,i} \leq CF_{max}^{1,i}$$

$$CF_{min}^{2,i} \leq CF^{2,i} \leq CF_{max}^{2,i} \quad (9)$$

wherein $CF_{min}$ and $CF_{max}$ are predetermined values, and $$\sum_{i=1}^n CF^{1,i}I_i^{1,R} = \sum_{i=1}^n I_i^{1,R} \quad (10)$$

$$\sum_{i=1}^n CF^{2,i}I_i^{2,R} = \sum_{i=1}^n I_i^{2,R}$$

wherein n designates the number of electrodes, $CF^{i,1}$ designates correction factors of step 1, $CF^{i,2}$ designates correction factors of step 2, $I^{1,R}$ designates the current of the i-th anode for process recipe R in step 1, and $I_i^{2,R}$ designates the current of the i-th anode for process recipe R in step 2.

The integration is performed as a one-dimensional integral from the wafer center to the edge R. A two-dimensional integral over the wafer surface could also be used, but would reduce the weight of the wafer center. The variable $Thk^{offset}$ was introduced to capture variations in overall thickness $QualThk(r)$ of the qualification wafers.

The focus of the control is to stabilize the copper profile across the wafer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for automatically optimizing a plating profile for a multi-step process recipe in a multi-anode plating tool, the method comprising:
   determining a tool state on the basis of a difference between a qualification profile of material deposited according to a qualification recipe with a plating tool that is in an unknown state and a target profile of material deposited according to the qualification recipe with a plating tool that is in a known tool state, wherein each of the qualification profile and the target profile includes a plurality of parts corresponding to each step of the multi-step recipe;
   calculating correction factors for each step of said multi-step process recipe for forming a material layer that reduce a difference between an estimated thickness profile of the material layer formed using the multi-step process recipe and a target profile of the material layer using an optimization function that simultaneously minimizes the difference across the plurality of steps of the multi-step process recipe.

2. The method of claim 1, wherein determining a tool state comprises defining an optimal tool state by setting a set of tool parameters in relation to the target profile for the qualification recipe.

3. The method of claim 1, wherein determining a tool state comprises measuring the qualification profile of deposited material for the qualification recipe at certain sites of a substrate and interpolating the measurement points.

4. The method of claim 1, wherein said calculating comprises expressing the target profile of the multi-step process recipe in terms of a difference between the target profile and the qualification profile of the qualification recipe for an optimal state of the plating tool.

5. The method of claim 1, wherein said calculating comprises expressing the estimated thickness profile in terms of a difference between the target profile and the qualification profile of the qualification recipe using said correction factors.

6. The method of claim 5, wherein said calculating includes a thickness offset to compensate for overall thickness variations.

7. The method of claim 5, wherein said calculating includes one dimensional integration across the substrate of the difference between the estimated profile of the process recipe and the target profile of the process recipe.

8. The method of claim 1, wherein a first step of the multi-step process recipe is adapted for providing the material layer in features having a first size, and a second step of the multi-step process recipe is adapted for providing the material layer in features having a size larger than the first size.

9. The method of claim 8, wherein said first step includes a pulse reverse current recipe.

10. The method of claim 8, wherein said second step includes a direct current recipe.

11. A method for automatically optimizing a plating profile for a multi-step process recipe comprising two or more steps in a multi-anode plating tool, comprising:
   a qualification process of determining a tool state for each step of a multi-step qualification recipe; and
   a tool setting process for tuning tool setting by deriving correction factors for the anode currents of the multi-anode plating tool for each step of the multi-step process recipe for forming a material layer that reduce a difference between an estimated thickness profile of the material layer formed using the multi-step process recipe and a target profile of the material layer using an optimization function that simultaneously minimizes the difference across the plurality of steps of the multi-step process recipe.

12. The method of claim 11, wherein a thickness profile according to a two step recipe is separated into two individual steps based on the following model:

$$Thk^R(r, \vec{CF}^{1,R}, \vec{CF}^{2,R}) := Thk^{1,R}(r, \vec{CF}^{1,R}) + Thk^{2,R}(r, \vec{CF}^{2,R}) := \qquad (1)$$

$$\frac{AS^{1,R}}{\sum_{k=1}^{4} CF_k^{1,R} I_k^{1,R}} \left( \sum_{i=1}^{4} S_i^1(r) CF_i^{1,R} I_i^{1,R} \right) +$$

$$\frac{AS^{2,R}}{\sum_{k=1}^{4} CF_k^{2,R} I_k^{2,R}} \left( \sum_{i=1}^{4} S_i^2(r) CF_i^{2,R} I_i^{2,R} \right)$$

wherein $Thk^R$ designates a thickness profile for a recipe R with given:
$I_k^{1,R}$ Anode currents of a recipe step 1;
$I_k^{2,R}$ Anode currents of a recipe step 2;
$CF_k^{1,R}$ correction factors of recipe step 1 for anode currents $I_k^{1,R}$;
$CF_k^{2,R}$ correction factors of recipe step 2 for anode currents $I_k^{2,R}$;
$AS^{1,R}$ charge of recipe step 1 (total deposition amount in step 1);
$AS^{2,R}$ charge of recipe step 2 (total deposition amount in step 2);
$S_i^1(r)$ sensitivity for Anode i on radius r in recipe step 1;
$S_i^2(r)$ sensitivity for Anode i on radius r in recipe step 2; and
n number of anodes
and wherein $Thk^{1,R}$ designates a thickness profile for a recipe R in step 1 and $Thk^{2,R}$ designates thickness profile for a recipe R in step 2.

13. The method of claim 12, wherein the qualification process comprises:
   measuring at certain sites of a substrate deposited material according to a qualification recipe and interpolating a thickness profile $QualThk^Q(r)$; and
   splitting the measured and interpolated thickness profile $QualThk^Q(r)$ into at least two parts according to the parts of the multi-step qualification recipe by using formula 1 for determining the two parts of measured and interpolated thickness profile $QualThk^Q(r)$ according to formula:

$$QualThk(r) := \qquad (2)$$

$$QualThk^1(r) + QualThk^2(r) := QualThk(r) \frac{Thk^{1,Q}(r, \vec{CF}^{1,Q})}{Thk^Q(r, \vec{CF}^{1,Q}, \vec{CF}^{2,Q})} +$$

$$QualThk(r) \frac{Thk^{2,Q}(r, \vec{CF}^{2,Q})}{Thk^Q(r, \vec{CF}^{1,Q}, \vec{CF}^{2,Q})}$$

wherein $Thk^Q(r, \vec{CF}^{1,Q}, \vec{CF}^{2,Q})$ designates a thickness profile for a corrected qualification recipe Q with particular correction factors $\vec{CF}^{1,Q}$, $\vec{CF}^{2,Q}$, $QualThk^Q(r)$ designates measured and interpolated thickness profile for a corrected qualification recipe Q with particular correction factors $\vec{CF}^{1,Q}$, $\vec{CF}^{2,Q}$ and reflects a tool state, $QualThk^{1,Q}(r, \vec{CF}^{1,Q})$ designates measured and interpolated thickness profile of step 1, and $QualThk^{2,Q}(r, \vec{CF}^{2,Q})$ designates measured and interpolated thickness profile of step 2.

14. The method of claim 13, wherein the qualification process further comprises:
   splitting a desired target thickness profile $T^Q(r)$ into at least two parts according to the steps of the multi-step qualification recipe by using formula 1 according to formula:

$$T^Q(r) := \qquad (3)$$

$$T^{1,Q}(r) + T^{2,Q}(r) := T^Q(r) \frac{Thk^{1,Q}(r, (1,1,1,1...))}{Thk^Q(r, (1,1,1,1...),(1,1,1,1...))} +$$

$$T^Q(r) \frac{Thk^{2,Q}(r, (1,1,1,1...))}{Thk^Q(r, (1,1,1,1...),(1,1,1,1...))}$$

wherein $Thk^Q r,(1,1,1,1 \ldots),(1,1,1,1 \ldots))$ designates a thickness profile for a qualification recipe Q for a plating tool under optimal conditions where correction factors are set to 1, $T^Q(r)$ designates desired target thickness profile and reflects an optimal tool state, $T^{1,Q}(r)$ designates desired target thickness profile of step 1 and $T^{2,Q}(r)$ designates desired target thickness profile of step 2.

15. The method of claim 14, wherein the qualification process further comprises:

determining a difference between a tool state QualThk$^Q$(r) and an optimal tool state T$^Q$(r) according to the following formula:

$$\Delta ToolState := \int_0^R (|QualThk^1(r) - T^{1,Q}(r)| + |QualThk^2(r) - T^{1,Q}(r)|) dr \quad (4)$$

16. The method of claim 15, wherein the qualification process further comprises:

adjusting correction factors for the qualification recipe Q by minimizing the difference ΔToolState according to the following formula:

$$\min_{\overrightarrow{CF}^{1,Q}, \overrightarrow{CF}^{2,Q}} \Delta ToolState \quad (5)$$

17. The method of claim 12, wherein the tool setting process comprises:

calculating a target profile T$^R$(r) for process recipe R for a deposition tool under optimal conditions in terms of a difference to target profile T$^Q$(r) of the qualification recipe Q:

$$T^R(r) := T^{1,R}(r) + T^{2,R}(r) := \quad (6)$$
$$\frac{AS^{1,R}}{AS^{1,Q}} \left[ T^{1,Q}(r) + \frac{AS^{1,Q}}{AS^{1,R}} Thk^{1,R}(r, (1,1,1,1...)) - Thk^{1,Q}(r, (1,1,1,1...)) \right] + \frac{AS^{2,R}}{AS^{2,Q}} \left[ T^{2,Q}(r) + \frac{AS^{2,Q}}{AS^{2,R}} Thk^{2,R}(r, (1,1,1,1...)) - Thk^{2,Q}(r, (1,1,1,1...)) \right]$$

wherein T$^R$(r) designates a desired target thickness profile of a process recipe, T$^{1,R}$(r) designates a desired target thickness profile of step 1; and T$^{2,R}$(r) designates a desired target thickness profile of step 2, T$^{1,Q}$(r) is used from formula 3 and reflects the optimal tool state for step 1; and T$^{2,Q}$(r) is used from formula 3 and reflects the optimal tool state for step 2, AS$^{1,R}$/AS$^{1,Q}$ and AS$^{2,R}$/AS$^{2,Q}$ designate changes of the charges of deposited material between the qualification recipe and the process recipe, Thk$^{1,Q}$(r,(1,1,1,1 ... )) and Thk$^{2,Q}$(r,(1,1,1, 1...)) are used from formula 3 and designate a thickness profile for a qualification recipe Q for a plating tool under optimal conditions where correction factors are set to 1; and Thk$^{1,R}$(r,(1,1,1,1 ... )) and Thk$^{2,R}$(r,(1,1,1, 1 ... )) designate a calculated thickness profile for a given process recipe R for a plating tool under optimal conditions where correction factors are set to 1.

18. The method of claim 14, wherein the tool setting process comprises:

calculating a target profile T$^R$(r) for process recipe R for a deposition tool under optimal conditions in terms of a difference to target profile T$^Q$(r) of the qualification recipe Q:

$$T^R(r) := T^{1,R}(r) + T^{2,R}(r) := \quad (6)$$
$$\frac{AS^{1,R}}{AS^{1,Q}} \left[ T^{1,Q}(r) + \frac{AS^{1,Q}}{AS^{1,R}} Thk^{1,R}(r, (1,1,1,1...)) - Thk^{1,Q}(r, (1,1,1,1...)) \right] + \frac{AS^{2,R}}{AS^{2,Q}} \left[ T^{2,Q}(r) + \frac{AS^{2,Q}}{AS^{2,R}} Thk^{2,R}(r, (1,1,1,1...)) - Thk^{2,Q}(r, (1,1,1,1...)) \right]$$

wherein T$^R$(r) designates a desired target thickness profile of a process recipe, T$^{1,R}$(r) designates a desired target thickness profile of step 1; and T$^{2,R}$(r) designates a desired target thickness profile of step 2, T$^{1,Q}$(r) is used from formula 3 and reflects the optimal tool state for step 1; and T$^{2,Q}$(r) is used from formula 3 and reflects the optimal tool state for step 2, AS$^{1,R}$/AS$^{1,Q}$ and AS$^{2,R}$/AS$^{2,Q}$ designate changes of the charges of deposited material between the qualification recipe and the process recipe, Thk$^{1,Q}$(r,(1,1,1,1 ... )) and Thk$^{2,Q}$(r,(1,1,1, 1...)) are used from formula 3 and designate a thickness profile for a qualification recipe Q for a plating tool under optimal conditions where correction factors are set to 1; and Thk$^{1,R}$(r,(1,1,1,1 ... )) and Thk$^{2,R}$(r,(1,1,1, 1 ... )) designate a calculated thickness profile for a given process recipe R for a plating tool under optimal conditions where correction factors are set to 1.

19. The method of claim 13, wherein the tool setting process further comprises:

calculating an estimated thickness profile ThkEst$^R$(r) for process recipe R in terms of a difference to the measured thickness profile according to a qualification recipe Q with the following formula:

$$ThkEst^R\left(r, \overrightarrow{CF}^{1,R}, \overrightarrow{CR}^{2,R}\right) := \quad (7)$$
$$ThkEst^{1,R}\left(r, \overrightarrow{CF}^{1,R}\right) + ThkEst^{2,R}\left(r, \overrightarrow{CF}^{2,R}\right) :=$$
$$\frac{AS^{1,R}}{AS^{1,Q}} \left[ Thk^{1,Q}(r) + \frac{AS^{1,Q}}{AS^{1,R}} Thk^{1,R}\left(r, \overrightarrow{CF}^{1,R}\right) - Thk^{1,Q}\left(r, \overrightarrow{CF}^{1,Q}\right) \right] +$$
$$\frac{AS^{2,R}}{AS^{2,Q}} \left[ Thk^{2,Q}(r) + \frac{AS^{2,Q}}{AS^{2,R}} Thk^{2,R}\left(r, \overrightarrow{CF}^{2,R}\right) - Thk^{2,Q}\left(r, \overrightarrow{CF}^{2,Q}\right) \right]$$

wherein Thk$^{1,Q}$(r) and Thk$^{2,Q}$(r) designate thickness profile calculated with formula 1 for the qualification recipe for step 1 and 2; AS$^{1,R}$/AS$^{1,Q}$ and AS$^{2,R}$/AS$^{2,Q}$ designate changes of the charges of deposited material between the qualification recipe Q and the process recipe R, Thk$^{1,Q}$(r, $\overrightarrow{CF}^{1,Q}$) and Thk$^{2,Q}$(r, $\overrightarrow{CF}^{2,Q}$) are used from formula 2 and designate a thickness profile for a qualification recipe Q for a plating tool in a known state; and Thk$^{1,R}$(r, $\overrightarrow{CF}^{1,R}$) and Thk$^{2,R}$ (r, $\overrightarrow{CF}^{1,R}$) designate a calculated thickness profile for a given process recipe R for a plating tool with arbitrary correction factors.

20. The method of claim 18, wherein the tool setting process further comprises:

calculating an estimated thickness profile ThkEst$^R$(r) for process recipe R in terms of a difference to the measured thickness profile according to a qualification recipe Q with the following formula:

$$ThkEst^R\left(r, \overrightarrow{CF}^{1,R}, \overrightarrow{CR}^{2,R}\right) := \tag{7}$$

$$ThkEst^{1,R}\left(r, \overrightarrow{CF}^{1,R}\right) + ThkEst^{2,R}\left(r, \overrightarrow{CF}^{2,R}\right) :=$$

$$\frac{AS^{1,R}}{AS^{1,Q}}\left[Thk^{1,Q}(r) + \frac{AS^{1,Q}}{AS^{1,R}}Thk^{1,R}\left(r, \overrightarrow{CF}^{1,R}\right) - Thk^{1,Q}\left(r, \overrightarrow{CF}^{1,Q}\right)\right] +$$

$$\frac{AS^{2,R}}{AS^{2,Q}}\left[Thk^{2,Q}(r) + \frac{AS^{2,Q}}{AS^{2,R}}Thk^{2,R}\left(r, \overrightarrow{CF}^{2,R}\right) - Thk^{2,Q}\left(r, \overrightarrow{CF}^{2,Q}\right)\right]$$

wherein $Thk^{1,Q}(r)$ and $Thk^{2,Q}(r)$ designate thickness profile calculated with formula 1 for the qualification recipe for step 1 and 2; $AS^{1,R}/AS^{1,Q}$ and $AS^{2,R}/AS^{2,Q}$ designate changes of the charges of deposited material between the qualification recipe Q and the process recipe R, $Thk^{1,Q}(r, \overrightarrow{CF}^{1,Q})$ and $Thk^{2,Q}(r, \overrightarrow{CF}^{2,Q})$ are used from formula 2 and designate a thickness profile for a qualification recipe Q for a plating tool in a known state; and $Thk^{1,R}(r, \overrightarrow{CF}^{1,R})$ and $Thk^{2,R}(r, \overrightarrow{CF}^{2,R})$ designate a calculated thickness profile for a given process recipe R for a plating tool with arbitrary correction factors.

21. The method of claim 18, wherein the tool setting process further comprises:

minimizing the difference between estimated thickness profile $ThkEst^R(r)$ for process recipe R and target profile $T^R(r)$ for process recipe R by varying step by step correction factors $\overrightarrow{CF}^R$ and thickness offset values $Thk^{offset}$ according to the following formula:

$$\min_{\overrightarrow{CF}^{1,R}, \overrightarrow{CF}^{2,R}, Thk^{offset}} \int_0^R \left|ThkEst^R\left(r, \overrightarrow{CF}^{1,R} \overrightarrow{CF}^{2,R}\right) - T^R(r) + Thk^{offset}\right| dr \tag{8}$$

with the following conditions:

$$CF_{min}^{1,i} \leq CF^{1,i} \leq CF_{max}^{1,i}$$

$$CF_{min}^{2,i} \leq CF^{2,i} \leq CF_{max}^{2,i} \tag{9}$$

wherein $CF_{min}$ and $CF_{max}$ are predetermined values, and $$\sum_{i=1}^{n} CF^{1,i} I_i^{1,R} = \sum_{i=1}^{n} I_i^{1,R} \tag{10}$$

$$\sum_{i=1}^{n} CF^{2,i} I_i^{2,R} = \sum_{i=1}^{n} I_i^{2,R}$$

wherein n designates the number of electrodes, $CF^{i,1}$ designates correction factors of step 1, $CF^{i,2}$ designates correction factors of step 2, $I_i^{1,R}$ designates the current of the i-th anode for process recipe R in step 1, and $I_i^{2,R}$ designates the current of the i-th anode for process recipe R in step 2.

22. The method of claim 20, wherein the tool setting process further comprises:

minimizing the difference between estimated thickness profile $ThkEst^R(r)$ for process recipe R and target profile $T^R(r)$ for process recipe R by varying step by step correction factors $\overrightarrow{CF}^R$ and thickness offset values $Thk^{offset}$ according to the following formula:

$$\min_{\overrightarrow{CF}^{1,R}, \overrightarrow{CF}^{2,R}, Thk^{offset}} \int_0^R \left|ThkEst^R\left(r, \overrightarrow{CF}^{1,R} \overrightarrow{CF}^{2,R}\right) - T^R(r) + Thk^{offset}\right| dr \tag{8}$$

with the following conditions:

$$CF_{min}^{1,i} \leq CF^{1,i} \leq CF_{max}^{1,i}$$

$$CF_{min}^{2,i} \leq CH^{2,i} \leq CF_{max}^{2,i} \tag{9}$$

wherein $CF_{min}$ and $CF_{max}$ are predetermined values, and $$\sum_{i=1}^{n} CF^{1,i} I_i^{1,R} = \sum_{i=1}^{n} I_i^{1,R} \tag{10}$$

$$\sum_{i=1}^{n} CF^{2,i} I_i^{2,R} = \sum_{i=1}^{n} I_i^{2,R}$$

wherein n designates the number of electrodes, $CF^{i,1}$ designates correction factors of step 1, $CF^{i,2}$ designates correction factors of step 2, $I_i^{1,R}$ designates the current of the i-th anode for process recipe R in step 1, and $I_i^{2,R}$ designates the current of the i-th anode for process recipe R in step 2.

23. The method of claim 11, wherein a first step of the multi-step process recipe is adapted for providing the material layer in features having a first size, and a second step of the process recipe is adapted for providing the material layer in features having a size larger than the first size.

24. The method of claim 23, wherein said first step includes a pulse reverse current recipe.

25. The method of claim 23, wherein said second step includes a direct current recipe.

\* \* \* \* \*